(12) United States Patent
Huang et al.

(10) Patent No.: US 10,530,324 B1
(45) Date of Patent: Jan. 7, 2020

(54) ON-DIE RESISTOR MEASUREMENT

(71) Applicant: Xilinx, Inc., San Jose, CA (US)

(72) Inventors: Gubo Huang, Milpitas, CA (US);
Xiaobao Wang, Cupertino, CA (US);
Andrew Tabalujan, Milpitas, CA (US);
Sing-Keng Tan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/107,117

(22) Filed: Aug. 21, 2018

(51) Int. Cl.
| | |
|---|---|
| *H03H 7/38* | (2006.01) |
| *G01R 27/14* | (2006.01) |
| *H01L 23/00* | (2006.01) |
| *H01L 25/18* | (2006.01) |
| *G11C 7/10* | (2006.01) |
| *G11C 5/06* | (2006.01) |

(52) U.S. Cl.
CPC .............. *H03H 7/38* (2013.01); *G01R 27/14* (2013.01); *G11C 5/06* (2013.01); *G11C 7/1048* (2013.01); *H01L 24/16* (2013.01); *H01L 25/18* (2013.01); *H01L 2224/16225* (2013.01); *H01L 2924/1426* (2013.01); *H01L 2924/1431* (2013.01); *H01L 2924/1434* (2013.01); *H01L 2924/30101* (2013.01); *H01L 2924/30111* (2013.01)

(58) Field of Classification Search
CPC .......... H03H 7/38; G11C 5/06; G11C 7/1048; H01L 25/18; H01L 24/16; H01L 2924/30111; H01L 2924/30101; H01L 2924/1434; H01L 2924/1426; H01L 2224/16225; H01L 2924/1431; G01R 27/14

USPC .......................................................... 326/30
See application file for complete search history.

(56) References Cited

U.S. PATENT DOCUMENTS

| | | | | |
|---|---|---|---|---|
| 5,585,741 | A | * | 12/1996 | Jordan ...................... G05F 1/56 326/30 |
| 8,222,918 | B1 | | 7/2012 | Tan |
| 8,446,167 | B2 | * | 5/2013 | Kao ................... H04L 25/0278 326/30 |
| 8,536,894 | B1 | | 9/2013 | Tan |
| 9,000,800 | B1 | | 4/2015 | Cical et al. |
| 9,767,921 | B1 | * | 9/2017 | Pan .................. G11C 29/50008 |
| 9,887,710 | B1 | | 2/2018 | Lim et al. |
| 9,911,465 | B1 | | 3/2018 | Camarota et al. |
| 2006/0158198 | A1 | * | 7/2006 | Fujisawa ................ G11C 29/02 324/601 |
| 2012/0007632 | A1 | * | 1/2012 | Kang ...................... G11C 7/04 326/30 |
| 2015/0091611 | A1 | * | 4/2015 | Jeong ................... G11C 29/028 326/30 |

(Continued)

*Primary Examiner* — Don P Le
(74) *Attorney, Agent, or Firm* — Patterson + Sheridan, LLP (57) ABSTRACT

Examples herein describe a die that includes a testing system (e.g., testing circuitry) for measuring the actual resistance of on-die resistors. When testing the die, an I/O element (e.g., a solder bump) can be used to sweep a voltage across the on-die resistor. The testing system identifies when the voltage across the on-die resistor reaches a predefined reference voltage and measures the corresponding current. Using the measured current and the reference voltage, the testing system can identify the actual resistance of the on-die resistor. In one embodiment, the on-die resistor is tunable such if the on-die resistor has a divergent value, the die can adjust its resistance value to the desired value.

20 Claims, 5 Drawing Sheets

(56) References Cited

U.S. PATENT DOCUMENTS

2017/0099050 A1* 4/2017 Lee .................. G11C 7/1057
2017/0179953 A1* 6/2017 Hardee ............. H03K 19/0005
2018/0375692 A1* 12/2018 Wieduwilt ......... H04L 25/0278

* cited by examiner

ON-DIE RESISTOR MEASUREMENT

TECHNICAL FIELD

Examples of the present disclosure generally relate to measuring the resistance of an on-die resistor.

BACKGROUND

Many integrated circuits (ICs) (also referred to herein as "dies") are coupled to external resistors (e.g., discrete components) since variation in the resistance values of external resistors is typically better controlled than on-die resistors. That is, because of variations in the fabrication process used to create on-die resistors, their resistance values can fluctuate as much as 10-15% depending on the process corner. Thus, instead of fabricating on-die resistors, the die may rely on external resistors to perform operations which require accurate resistance values.

However, there are several disadvantages with using external resistors. For example, the external resistor take up valuable space in a package. Further, the die needs to use at least one I/O element (e.g., an input/output (I/O) pin) to couple to the external resistor which leaves one less I/O element that can be used by the die to perform another function. Put differently, the system may require that the die include a dedicated I/O pin that couples the die to the external resistor.

SUMMARY

Techniques for measuring the resistance value of an on-die resistor are described. One example is a method that includes incrementing a voltage at an I/O element of a die where the I/O element is electrically coupled to a first side of the on-die resistor in the die. The method also includes monitoring an output of a comparator in the die where a first input of the comparator is coupled to the first side of the on-die resistor and a second input of the comparator is coupled to a reference voltage, measuring a current flowing through the I/O element in response to the output of the comparator switching from a first value to a second value, and determining the resistance value of the on-die resistor based on the measured current and the reference voltage.

One example described herein is a system that includes a die comprising an on-die resistor and a testing system coupled to the die. The testing system is configured to increment a voltage at an I/O element of a die where the I/O element is electrically coupled to a first side of the on-die resistor in the die and monitor an output of a comparator in the die where a first input of the comparator is coupled to the first side of the on-die resistor and a second input of the comparator is coupled to a reference voltage. The testing system is also configured to measure a current flowing through the I/O element in response to the output of the comparator switching from a first value to a second value and determine a resistance value of the on-die resistor based on the measured current and the reference voltage.

One example described herein is a semiconductor die that includes an on-die resistor, an I/O element coupled to a first end of the on-die resistor, and a comparator where a first input of the comparator is coupled to the first end of the on-die resistor and a second input of the comparator is coupled to a reference voltage. Moreover, an output of the comparator is configured to switch from a first value to a second value when a voltage across the on-die resistor matches the reference voltage. The semiconductor die also includes an adjustment circuit configured to adjust a resistance value of the on-die resistor to match a desired value.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for measuring the resistance of an on-die resistor. As mentioned above, the resistance value of resistors integrated into a semiconductor chip or die can vary depending on the process corner associated with the die. Although the manufacture can indicate, or track, the process corner the in which die was formed, this provides only a rough estimate of the actual resistance value of the on-die resistor. Put differently, by knowing the process corner, the manufacture can give a customer a general idea of how far the resistance value of the on-die resistor may be from a designed (or desired) resistance value. Nonetheless, this estimate may not be accurate enough for some situations that rely on resistors with accurate resistance values such as when calibrating drivers, transmitters, receivers, etc.

The embodiments herein describe a die that includes a testing system (e.g., which can include software/hardware external to the die as well as testing circuitry on the die) for measuring the actual resistance of on-die resistors. When testing the die, the testing system uses an I/O element (e.g., a solder bump) to sweep a voltage across the on-die resistor. The testing system identifies when the voltage across the on-die resistor reaches a predefined reference voltage and measures the corresponding current. Using the measured current and the reference voltage, the testing system can identify the actual resistance of the on-die resistor. In one embodiment, the on-die resistor is tunable such if the on-die resistor has a divergent value, the die can adjust its resistance value to the desired value.

Figure 1:
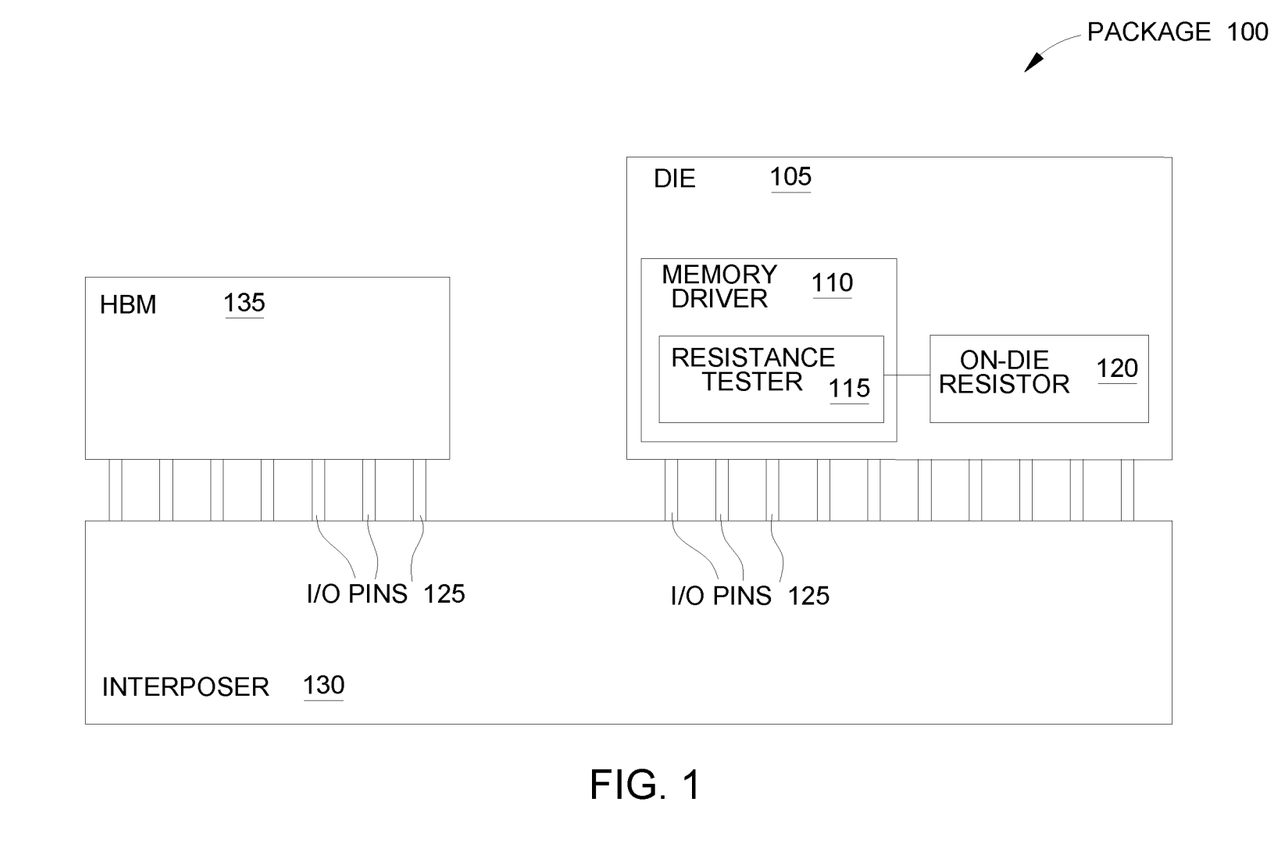
FIG. 1 is a block diagram of a package that includes an on-die resistor, according to an example.

FIG. 1 is a block diagram of a package 100 that includes an on-die resistor 120, according to an example. In one embodiment, the package 100 is a system in package (SiP) but is not limited to such. As shown, the package 100 includes a semiconductor die 105 (e.g., a semiconductor chip or integrated circuit) and a high bandwidth memory (HBM) 135 mounted on an interposer 130. The interposer 130 provides high-speed communication between the HBM 135 and the die 105. In one embodiment, the HBM 135 is a high-performance RAM interface which stores data generated by the die 105. The HBM 135 can be connected to a variety of different types of dies 105 such as a central processing unit (CPU), graphics processing unit (GPU), or field programmable gate array (FPGA).

In one embodiment, the HBM 135 can communicate only with the die 105. That is, while the die 105 may be able to communicate with other devices using the interposer 130 (e.g., other dies on the interposer 130 or an external computing system coupled to lower side of the interposer 130), the HBM 135 may be communicatively coupled to only the die 105 and the interposer 130. Further, the I/O interfaces in the HBM 135 and the die 105 used to communicate with each other may be inaccessible to other devices (or to the user operating the package 100). For example, the die 105 includes a memory driver 110 for transmitting data from the die 105 to the HBM 135 via the interposer 130. To do so, one or more of the I/O pins 125 that communicatively couple the die 105 to the interposer 130 are assigned to the driver 110 which the driver 110 uses to transmit data to the HBM 135. Although not shown, the interposer 130 (e.g., a semiconductor substrate) includes one or more data paths (e.g., wire traces, vias, etc.) which couple the I/O pin 125 assigned to the memory driver 110 to a corresponding I/O pin 125 on the HBM 135. The user (or other device) may be unable to access the communication interface between the die 105 and the HBM 135. Thus, to the perspective of the user, the HBM 135 and the die 105 can appear as being an integrated system rather than two separate substrates or devices as shown in FIG. 1.

The die 105 includes the on-die resistor 120 which is coupled to the memory driver 110. In one embodiment, the die 105 uses the on-die resistor 120 to calibrate the memory driver 110. For example, a standard associated with the HBM 135 may stipulate that the memory driver 110 be calibrated to have a predefined resistance value. When being fabricated, the on-die resistor 120 is designed to have the predefined resistance value indicated in the standard and during a calibration process, the die 105 can tune the memory driver 110 to match the resistance of the on-die resistor 120. However, if the actual resistance value of the on-die resistor 120 does not match the predefined resistance value in the standard (e.g., due to variations in the fabrication process), the memory driver 110 is tuned to the incorrect value and communication between the die 105 and the HBM 135 can be negatively impacted.

To compensate for variations in the resistance of the on-die resistor 120 when fabricating the die 105, the memory driver 110 includes a resistance testor 115 which measures the resistance of the on-die resistor 120. In one embodiment, the resistance testor 115 includes circuitry which determines the resistance of the on-die resistor 120 and its deviation from a desired resistance. In one embodiment, the on-die resistor 120 is a variable resistor so that the die 105 can change its resistance value. Thus, if the resistance testor 115 determines the on-die resistor 120 deviates from the desired resistance, the die 105 can adjust the on-die resistor 120 (e.g., by adding additional resistance in series or parallel) until its resistance matches the desired resistance. In this manner, the die 105 can identify and correct deviations in the resistance value of the on-die resistor 120.

Using the on-die resistor 120 rather than a discrete resistor can free up one of the I/O pins 125 that would otherwise be used to attach the memory driver 110 to the discrete resistor. That is, in other embodiments, the package 100 may include a discrete resistor that is mounted on the interposer 130. To use the discrete resistor for calibration, the die 105 would be coupled to the discrete resistor using one of the I/O pins 125. This I/O pin 125 could no longer be used for other purposes such as communicating with other chips or dies on the interposer 130, or communicating with an external computing system. However, be eliminating the discrete resistor and adding the on-die resistor 120 to the die 105, the package 100 has an extra I/O pin 125 which can be used for other purposes, thereby expanding the capabilities of the package 100.

Although not shown, the interposer 130 may include solder bumps on the side opposite the side connecting to the HBM 135 and the die 105. These solder bumps can permit the die 105 to communicate with an external computing system. However, FIG. 1 is just one example of a package 100 in which a die 105 with an on-die resistor 120 can be used. For example, rather than a 2.5D arrangement as shown, one or more HBMs 135 (and other dies or devices) can be stacked on or under the die 105 to form a 3D stack. The devices can use solder bumps and through vias to communicate. In this example, instead of I/O pins 125, the solder bumps can permit the die 105 to communicate directly with the HBM 135—e.g., without relying on the interposer 130, which can be omitted.

Figure 2:
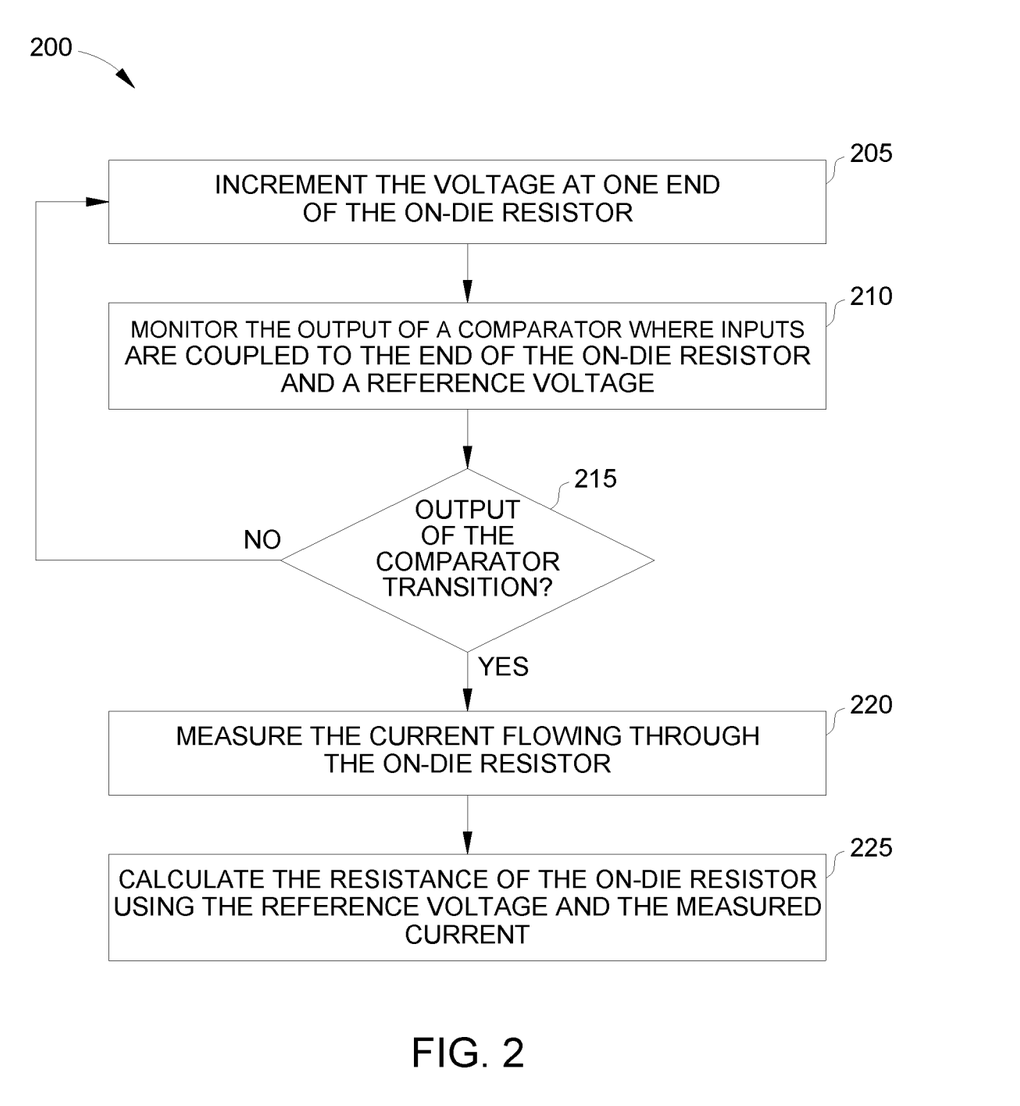
FIG. 2 is a flowchart for measuring the resistance of an on-die resistor, according to an example.

FIG. 2 is a flowchart of a method 200 for measuring the resistance of an on-die resistor, according to an example. For clarity, the blocks in the method 200 are discussed in tandem with FIG. 3 which illustrates a testing system 300 for measuring the resistance of an on-die resistor, according to an example. The testing system 300 includes a test solder bump 350 (e.g., I/O element) on the die 105 which permits an external testing application 360 (e.g., software, hardware, or combination of both) to drive a testing voltage onto the on-die resistor 120. The test solder bump 350 is just one example of a suitable I/O element for coupling the external testing application 360 to the die, and more specifically, to the on-die resistor 120. Other examples can include a pin, wire bond, contact pad, and the like. In one embodiment, the test solder bump 350 may be unused for data communication when the die is mounted onto the interposer 130 illustrated in FIG. 1. Put differently, the test solder bump 350 may be an extra or spare solder bump which can be used to determine the actual resistance of the on-die resistor 120. The test solder bump 350 may be used when testing the die 105, but is unused during normal operation after the die 105 has been mounted in a package.

Figure 3:
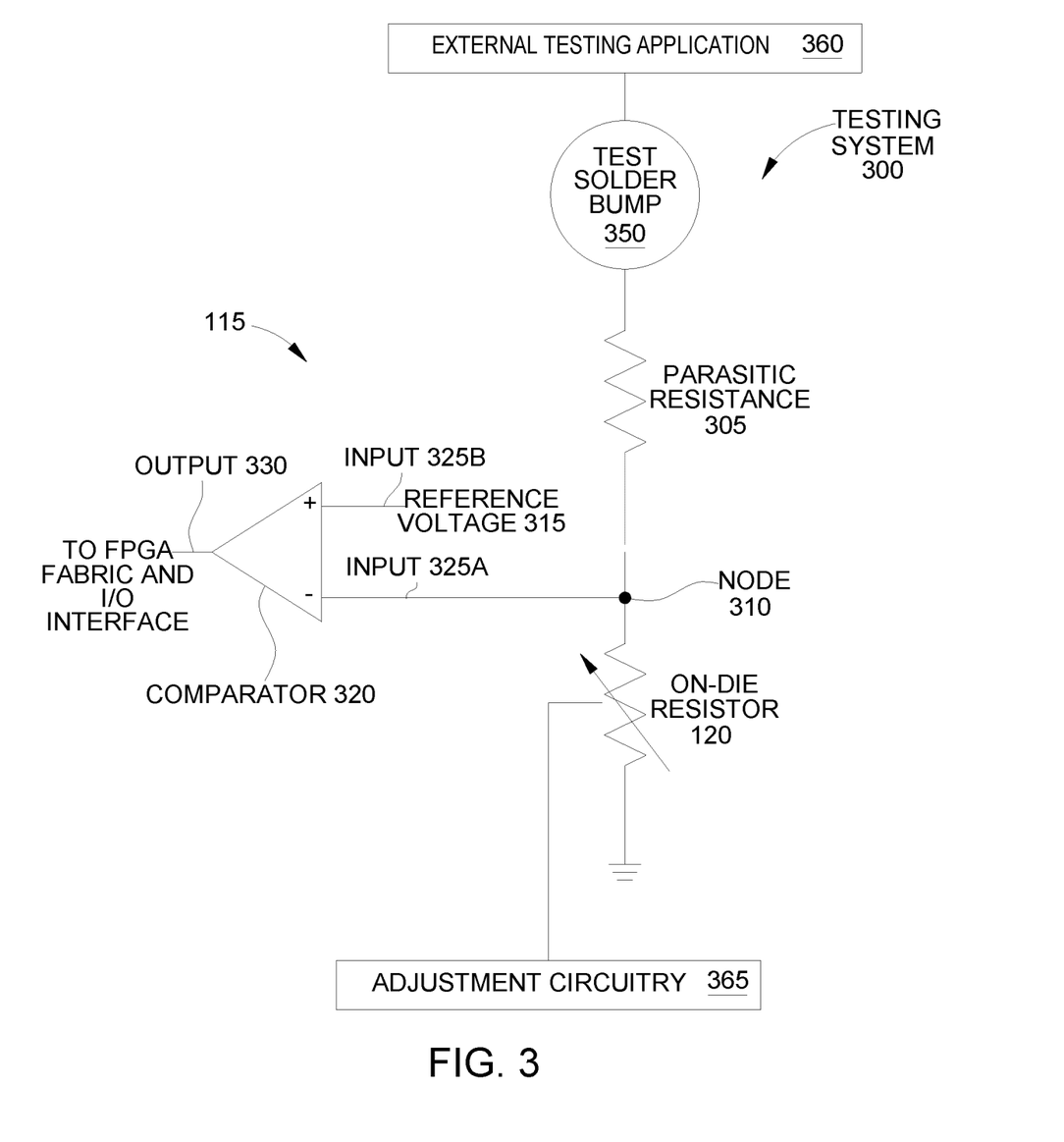
FIG. 3 is a testing system for measuring the resistance of an on-die resistor, according to an example.

At block 205, the external testing application 360 increments the voltage at one end of the on-die resistor. In one embodiment, before the die containing the resistor is mounted in a package, a probe from the external testing application 360 is attached to the test solder bump 350 which is connected by one or more metal traces to the on-die resistor 120. The resistance of these metal traces is represented in FIG. 3 by a parasitic resistance 305. Unlike the on-die resistor 120 which is designed to be a resistor having a specific resistance value, the parasitic resistance 305 represents the inherent resistance of the electrical path that couple the on-die resistor 120 to the test solder bump 350. Thus, the resistance of the parasitic resistance 305 can vary depending on a variety of factors such as the length of the metal traces in the electrical path (e.g., the distance of the on-die resistor 120 from the test solder bump 350), the width of the metal traces, the material of the metal traces, the number of bends in the metal traces, and so forth. In one embodiment, the resistance value of the parasitic resistance 305 is unknown (like the resistance of the on-die resistor 120) when the die is fabricated. In one embodiment, the resistance of the parasitic resistance 305 is measured in parallel with measuring the resistance of the on-die resistor 120.

When the voltage is applied on the test solder bump 350, the voltage at a node 310 which is located at one end of the on-die resistor 120 is unknown. That is, because the value of the parasitic resistance 305 is unknown, then the value of the voltage at the node 310 is also unknown. However, using method 200, the testing system 300 can identify the voltage at the node 310 and then determine the voltage across the on-die resistor 120. That is, because the other end of the resistor 120 is coupled directly to ground (or any other known reference voltage), once the voltage at the node 310 is known, the testing system 300 can calculate the value of the voltage across the on-die resistor 120.

At block 210, the testing system 300 monitors the output of a comparator 320 whose inputs are coupled to the end of the on-die resistor and a reference voltage. As shown in FIG. 3, the comparator 320 has a first input 325A coupled to the node 310 (which is located at one end of the resistor 120) and a second input 325B coupled to a reference voltage 315. The value of the reference voltage 315 is known (e.g., VCC or some percentage thereof). If the reference voltage 315 is greater than the voltage at the node 310, then an output 330 of the comparator 320 is one value (e.g., a high value) but once the voltage at the node 310 reaches or exceeds the reference voltage 315, the output 330 of the comparator 320 switches to another value (e.g., a low value). Put differently, so long as the value of the input 325A is less than the value of the reference voltage 315 at input 325B, the output of the comparator 320 is a first value. However, as the external testing application 360 increases (at intervals) the voltage on the test solder bump 350 thereby increasing the voltage at the node 310, eventually the voltage at the node 310 meets or exceeds the value of the reference voltage 315, and at that point, the value of the output 330 of the comparator 320 switches values.

In one embodiment, the output 330 of the comparator 320 is coupled to a fabric in the die (e.g., a FPGA or other IC) and an I/O interface which permits the value of the output 330 to be monitored by the external testing application 360. That is, using software and the I/O interface, the testing system can monitor the output 330 to determine whether the value of the output 330 has switched as the voltage on the test solder bump 350 is increased. For example, during testing, the external testing application 360 may also be coupled to the I/O pins (e.g., the I/O interface) on the die so that the testing system 300 can monitor the output 330 of the comparator 320 to determine when the output 330 switches values.

At block 215, the testing system 300 determines whether the output 330 of the comparator 320 has switched values.

If not, the method 200 returns to block 205 where the probe testing system increments the voltage at the end of the on-die resistor 120 by incrementing the voltage applied on the test solder bump 350. Put differently, the external testing application 360 sweeps the voltage on the test solder bump 350 until the output 330 of the comparator 320 switches values. Of course, the voltage on the test solder bump 350 can be swept from a high voltage to a low voltage, or vice versus. Depending on the voltage sweep, the output 330 may change from low to high or from high to low once the voltage at the node 310 reaches the value of the reference voltage 315.

Once the output 330 of the comparator 320 switches, the method 200 proceeds to block 220 where the external testing application 360 measures the current flowing through the on-die resistor. In FIG. 3, the current flowing the on-die resistor 120 is the same current flowing through the test solder bump 350 (since the input 325A of the comparator 320 has essentially infinite input impedance). As such, the external testing application 360 can measure the current it injects into the test solder bump 350 to determine the current flowing through the on-die resistor 120.

At block 225, the testing system 300 calculates the resistance of the on-die resistor 120 using the reference voltage 315 and the measured current. That is, the resistance of the on-die resistor 120 can be expressed using Ohm's law as:

$$R_{on\text{-}die} = \frac{V_{ref}}{I_{measured}} \qquad (1)$$

Because the node 310 is at, or very near, the end of the on-die resistor 120, the voltage at the node 310 represents the voltage across the resistor 120. Put differently, because the other end of the on-die resistor 120 is coupled to ground, the voltage across the resistor 120 is the voltage at the node 310. Moreover, because the output 330 of the comparator 320 has switched, the testing system 300 determines that the voltage at the node 310 is the same (or very close) to the voltage of the reference voltage 315. Thus, the testing system 300 determines that the voltage across the resistor 120 is the same as the reference voltage 315. Using Equation 1, the probe testing system can divide the reference voltage 315 by the measured current to generate the actual value of the resistance ($R_{on\text{-}die}$) of the on-die resistor 120.

Moreover, if desired, the probe testing system can also measure the value of the parasitic resistance 305. To do so, the testing system 300 can subtract the value of the voltage being driven on the test solder bump 350 from the reference voltage 315 (which is the same as the voltage at the node 310) to determine the voltage across the parasitic resistance 305 formed by the electrical path in the die coupling the test solder bump 350 to the on-die resistor 120. This voltage can then be divided by the current measured at block 220 (since the same current flows through the parasitic resistance 305 and the on-die resistor 120) to generate the resistance value of the parasitic resistance 305.

In this manner, the method 200 and the testing system 300 can be used to identify the value of the on-die resistor 120 and the parasitic resistance 305. As discussed below, once the value of the resistor 120 is known, the resistor 120 can be adjusted using an adjustment circuit 365 in the die to ensure it matches a desired value.

Figure 4:
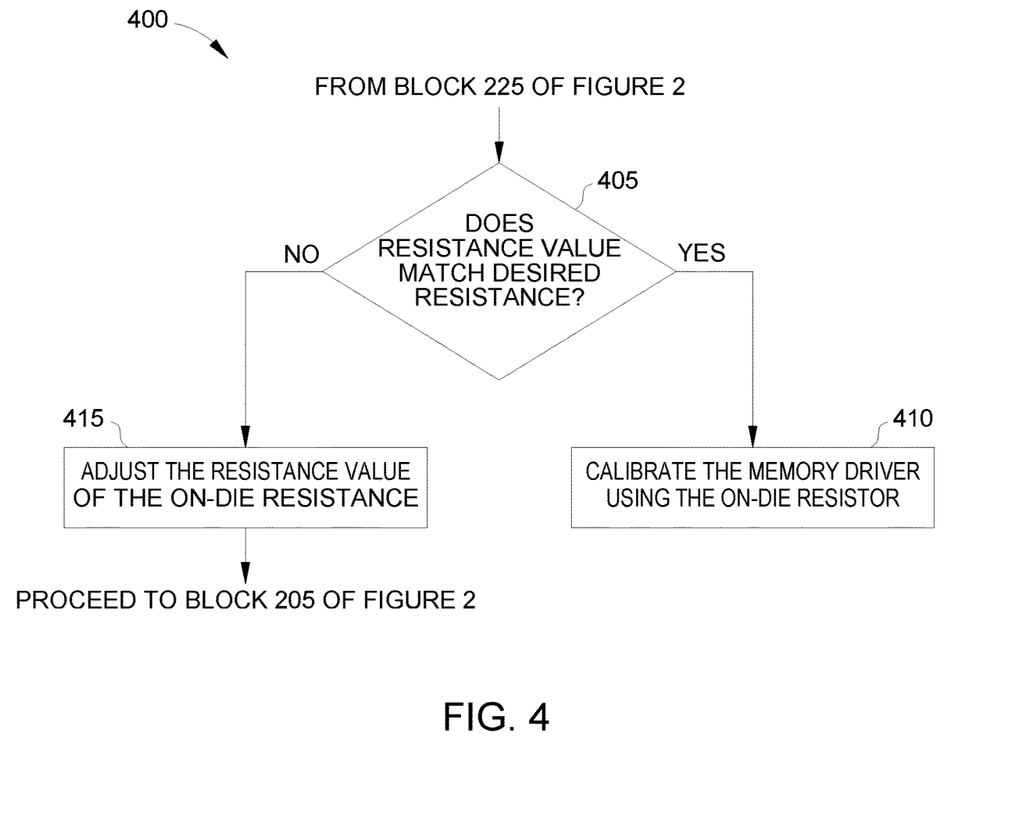
FIG. 4 is a flowchart for adjusting the resistance of an on-die resistor, according to an example.

FIG. 4 is a flowchart of a method 400 for adjusting the resistance of an on-die resistor, according to an example. In one embodiment, the method 400 begins after block 225 of FIG. 2 when the value of the on-die resistor has been calculated. At block 405, the external testing application (or an internal calibration system in the die) determines whether the resistance value of the on-die resistor matches a desired resistance. As explained above, the on-die resistor may be used to calibrate circuitry in the die, and as such, should have a specific resistance. However, this is only one possible use for an on-die resistor and the embodiments herein can be used to measure the value of any on-die resistor regardless of its use in the die.

If the resistance value does not match, the method 400 proceeds to block 415 where the resistance value of the on-die resistor is adjusted. For example, the external testing application or an internal calibration circuit may send control signals to an adjustment circuit in the die (e.g., the adjustment circuit 365 in FIG. 3) which adds or removes resistance in parallel or series to the on-die resistor in order to change the value of the resistor to the desired value. Once adjusted, the method 400 may return to block 205 of FIG. 2 where the voltage on the test solder bump is again swept until the output of the comparator switches and the new resistance of the on-die resistor is measured. Put differently, the method 200 can be repeated to again measure the resistance value of the on-die resistor which was changed during method 400. Block 405 can then be repeated to determine whether the new resistance value matches the desired value, and if not, block 415 can again change the resistance value.

Once the value of the on-die resistor matches the desired value, the method 400 proceeds to block 410 where a memory driver is calibrated using the on-die resistor. In one embodiment, the memory driver includes at least one PMOS driver portion and at least one NMOS driver portion. The PMOS driver portion can be coupled to the on-die resistor and adjusted until its internal resistance matches the resistance of the on-die resistor. The NMOS driver portion can then be coupled to the calibrated PMOS driver portion and adjusted until its internal resistance matches the resistance of the calibrated PMOS driver portion. In this manner, both the PMOS and NMOS portions of the memory driver have internal resistances that match the resistance of the on-die resistor. However, this is only one example of calibrating the memory driver using the on-die resistor.

Figure 5:
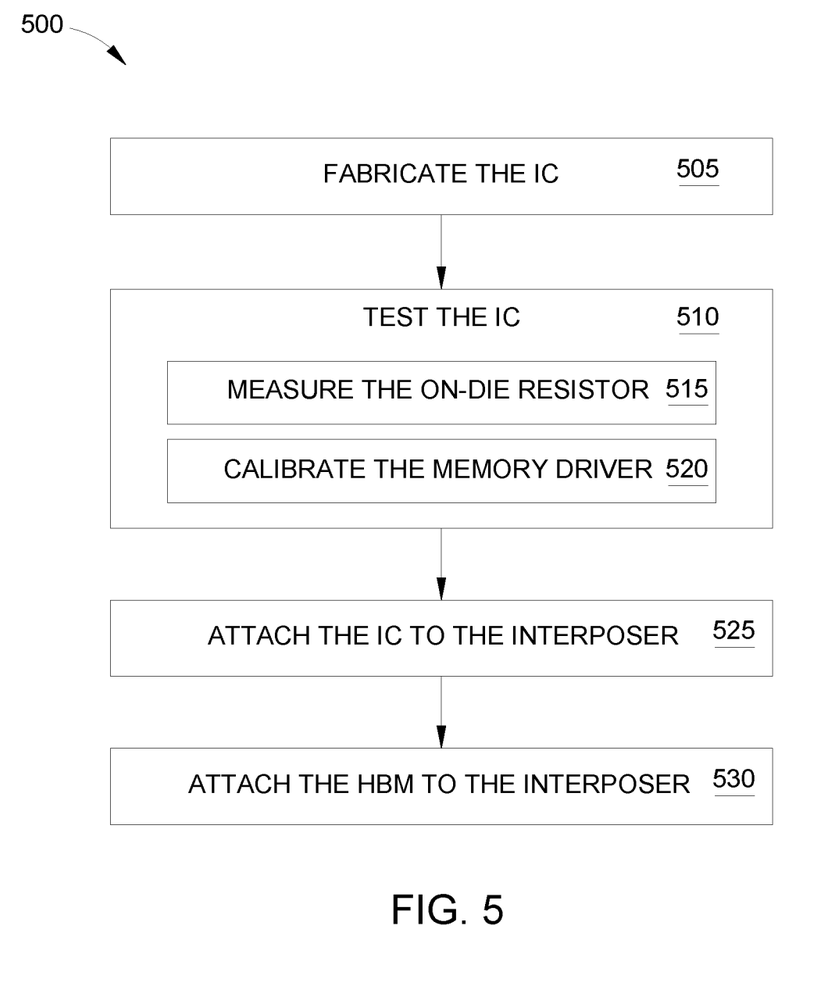
FIG. 5 is a flowchart for assembling a package that includes an on-die resistor, according to an example.

FIG. 5 is a flowchart of a method 500 for assembling a package that includes an on-die resistor, according to an example. At block 505, the IC is fabricated to form a die that includes the on-die resistor. In one embodiment, the IC may be part of a wafer that includes multiple other copies of the IC. As discussed above, where the IC is located on the wafer (e.g., its process corner) can affect the actual resistance value of the on-die resistor. Moreover, the fabrication process used when fabricating each wafer can vary. Thus, the resistance value of the on-die resistors can vary depending on which batch the IC was formed in as well as the process corner associated with the IC.

At block 510, the testing system tests the IC or die. Testing the IC can include two different blocks: block 515 where the resistance of the on-die resistor is measured and block 520 where the memory driver is calibrated using the on-die resistor. The details of one example for performing block 515 were described in the method 200 while the details of one example for performing block 520 were described in the method 400 as thus will not be described here.

Block 510 may be performed before the IC has been cleaved or sawed from the wafer (e.g., before the IC is separated from the other ICs formed on the wafer) or after the wafer has been cleaved or sawed to form the individual ICs or dies. In one embodiment, the IC is mounted on a printed circuit board (PCB) in order to couple the IC to the external testing application. For example, a probe of the external testing application can be attached to a pad on the PCB which in turn is electrically coupled to the test solder bump 350 illustrated in FIG. 3. In this manner, the external testing application can sweep the voltage on the on-die resistor 120 using the test solder bump 350. Moreover, the PCB may also provide connections to I/O pins on the IC so that the external testing application can monitor the output of the comparator described above so that the resistance value of the on-die resistor can be measured.

Once testing and calibration is complete, the IC may be removed from the PCB and disconnected from the external testing application. That is, the IC may be temporary mounted onto a testing substrate (e.g., the PCB) and then removed from that substrate once the testing process is complete.

At block 525, the IC is attached to the interposer. For example, the I/O pins of the IC may be mated with corresponding connections in the interposer. Doing so connects the IC with the various electrical paths in the interposer. As described above, the interposer can include electrical paths that couple the IC to other ICs or dies on the interposer as well to an external system (e.g., an external computing system). For example, the package formed by the interposer and the IC can be disposed in, or mounted to, the external computing system.

At block 530, the HBM is attached to the interposer, thereby communicatively coupling the HBM to the IC. In one embodiment, the interconnects between the HBM and the IC are not accessible to the external computing system. That is, to the perspective of the user, the HBM and the IC do not appear as two separate devices but rather one integrated system where data can be transferred between the HBM and the IC without relying on instructions from the user.

Although not shown in FIG. 5, other fabrication steps can be performed such as applying a molding around the HBM and the IC to provide structural support, prevent damage, and provide electrical isolation. Further, the side of the interposer not coupled to the HBM and the IC can include solder bumps for coupling the interposer to a PCB. The PCB can then be connected to a computing system so that the computing system can communicate with the IC.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects described herein may take the form of an entirely hardware embodiment, an entirely software embodiment (including firmware, resident software, micro-code, etc.) or an embodiment combining software and hardware aspects that may all generally be referred to herein as a "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for measuring a resistance value of an on-die resistor, comprising:
   incrementing a voltage at an I/O element of a semiconductor die using a testing application coupled to the I/O element, wherein the I/O element is electrically coupled to a first side of the on-die resistor in the semiconductor die and the testing application is external to the semiconductor die;
   monitoring an output of a comparator in the semiconductor die, wherein a first input of the comparator is coupled to the first side of the on-die resistor and a second input of the comparator is coupled to a reference voltage;
   measuring a current flowing through the I/O element in response to the output of the comparator switching from a first value to a second value; and
   determining the resistance value of the on-die resistor based on the measured current and the reference voltage.

2. The method of claim 1, wherein incrementing the voltage at the I/O element comprises:
   sweeping the voltage on the I/O element until the output of the comparator switches from the first value to the second value.

3. The method of claim 1, wherein a second end of the on-die resistor is coupled to ground, wherein a voltage across the on-die resistor is the same as the reference voltage when the output of the comparator switches from the first value to the second value.

4. The method of claim 1, wherein the I/O element is coupled to the on-die resistor via an electrical path in the semiconductor die having an associated parasitic resistance, wherein the method comprises:
   subtracting the voltage at the I/O element from the reference voltage to identify the voltage across the parasitic resistance; and
   determining a resistance value of the parasitic resistance based on the voltage across the parasitic resistance and the measured current.

5. The method of claim 1, wherein determining the resistance value of the on-die resistor comprises:
   dividing the reference voltage by the measured current.

6. The method of claim 1, further comprising:
   upon determining the resistance value of the on-die resistor does not match a desired resistance, adjusting the resistance value of the on-die resistor to match the desired resistance.

7. The method of claim 6, further comprising:
   calibrating a memory driver in the semiconductor die using the on-die resistor after the on-die resistor has been adjusted to match the desired resistance.

8. A system comprising:
   a die comprising an on-die resistor;
   a testing application coupled to the die, wherein the testing application is configured to:
      increment a voltage at an I/O element of the die, wherein the I/O element is electrically coupled to a first side of the on-die resistor in the die;
      monitor an output of a comparator in the die, wherein a first input of the comparator is coupled to the first side of the on-die resistor and a second input of the comparator is coupled to a reference voltage;
      measure a current flowing through the I/O element in response to the output of the comparator switching from a first value to a second value; and
      determine a resistance value of the on-die resistor based on the measured current and the reference voltage.

9. The system of claim 8, wherein incrementing the voltage at the I/O element comprises:
   sweeping the voltage on the I/O element until the output of the comparator switches from the first value to the second value.

10. The system of claim 8, wherein a second end of the on-die resistor is coupled to ground, wherein a voltage across the on-die resistor is the same as the reference voltage when the output of the comparator switches from the first value to the second value.

11. The system of claim 8, wherein the I/O element is coupled to the on-die resistor via an electrical path in the die having an associated parasitic resistance, wherein the testing application is configured to:
   subtract the voltage at the I/O element from the reference voltage to identify the voltage across the parasitic resistance; and
   determine a resistance value of the parasitic resistance based on the voltage across the parasitic resistance and the measured current.

12. The system of claim 8, wherein the testing application is configured to:
   upon determining the resistance value of the on-die resistor does not match a desired resistance, adjust the resistance value of the on-die resistor to match the desired resistance.

13. The system of claim 12, wherein the testing application is configured to:
   calibrate a memory driver in the die using the on-die resistor after the on-die resistor has been adjusted to match the desired resistance.

14. A semiconductor die, comprising:
   an on-die resistor;
   an I/O element coupled to a first end of the on-die resistor; and
   a comparator, wherein a first input of the comparator is coupled to the first end of the on-die resistor and a second input of the comparator is coupled to a reference voltage,
   wherein an output of the comparator is configured to switch from a first value to a second value when a voltage across the on-die resistor matches the reference voltage; and
   an adjustment circuit configured to adjust a resistance value of the on-die resistor to match a desired value based on the output of the comparator.

15. The semiconductor die of claim 14, wherein the I/O element is a solder bump and wherein the semiconductor die further comprises:
   an electrical path coupling the solder bump to on-die resistor, wherein a parasitic resistance associated with the electrical path results in the voltage driven onto the solder bump being different from the voltage at the first end of the on-die resistor.

16. The semiconductor die of claim 14, wherein a second end of the on-die resistor is coupled to ground, wherein, when driving a voltage onto the I/O element, a current through the I/O element is the same as the current flowing through the on-die resistor.

17. The semiconductor die of claim 14, wherein the adjustment circuit adjusts the resistance value based on an external testing application or an internal calibration circuit.

18. The semiconductor die of claim 14, further comprising:
   a memory driver coupled to the on-die resistor, wherein the on-die resistor is a calibration resistor for calibrating the memory driver.

19. The semiconductor die of claim 18, wherein the memory driver is configured to transmit data signals to a high-bandwidth memory after being calibrated using the on-die resistor.

20. The semiconductor die of claim 14, wherein the semiconductor die is a field programmable gate array (FPGA), wherein the output of the comparator is coupled to an FPGA fabric.

\* \* \* \* \*